United States Patent [19]

Helderman et al.

[11] Patent Number: 4,847,445
[45] Date of Patent: Jul. 11, 1989

[54] ZIRCONIUM THIN-FILM METAL CONDUCTOR SYSTEMS

[75] Inventors: Earl R. Helderman, Hillsboro; Robert E. Holmes, Portland; Robert R. Zimmerman, Beaverton, all of Oreg.

[73] Assignee: Tektronix, Inc., Beaverton, Oreg.

[21] Appl. No.: 697,099

[22] Filed: Feb. 1, 1985

[51] Int. Cl.⁴ .............................................. H05K 1/09
[52] U.S. Cl. ................................... 174/68.5; 361/411; 427/96; 427/123; 428/209
[58] Field of Search ............... 361/402, 411; 174/68.5; 427/96, 259, 343; 428/209

[56] References Cited

U.S. PATENT DOCUMENTS 3,621,442 11/1971 Racht et al. ..................... 361/402 X
3,647,585 3/1972 Fritzinger et al. ............. 174/68.5 X
3,699,011 10/1972 Nishimura ........................ 361/402 X
3,860,450 1/1975 Nicolet et al. ..................... 427/96 X
3,872,356 3/1975 Kruger et al. ..................... 427/96 X
4,358,748 11/1982 Gruner et al. .................. 428/209 X
4,385,966 5/1985 Keller et al. ........................ 204/37.1
4,751,349 6/1988 Kim et al. ............................ 174/68.5

Primary Examiner—R. R. Kucia
Attorney, Agent, or Firm—John D. Winkelman; Richard J. Polley

[57] ABSTRACT

A thin-film metal conductor system using a zirconium adhesion layer is disclosed. The system is formed by first plating a layer of zirconium over a substrate material and any electrical components, such as resistors, which are fixed on the substrate. A conductive layer is then deposited over those portions of the zirconium layer which are to provide conductive pathways. The resulting unit is thermally treated in an oxidizing environment, such as air, to oxidize the exposed portions of the zirconium layer and thereby form regions of zirconium oxide. The zirconium oxide is nonconductive and protects underlying components from moisture and physical abrasion.

5 Claims, 1 Drawing Sheet

ZIRCONIUM THIN-FILM METAL CONDUCTOR SYSTEMS

BACKGROUND OF THE INVENTION

This invention relates to thin-film metal conductor systems and methods for the manufacture thereof.

Recent advances in microelectronics have created a demand for cost-effective, thin-film conductor systems for joining the components of a board mounted electrical circuit. Commonly used conductor systems comprise superposed layers of titanium, palladium, and gold.

For example, U.S. Pat. No. 4,385,966, issued May 31, 1983 to Keller et al. discloses a method for fabricating resistors and capacitors with electrical interconnections of Ti, Pd and Au. Ti, Pd, Au are deposited on a substrate material which bears electrical components, such as NiCr resistors. First, a Ti adhesion layer is deposited to provide a surface on which a subsequently deposited layer can bond. This layer is required since highly conductive metals, such as gold, do not adhere well to common substrate materials such as aluminum oxide wafers. A Pd layer is then deposited, followed by at least one Au layer. Next, a standard etching technique is used to form the metal layers into desired conductive paths and to uncover the surfaces of resistors and other components. The completed unit is then annealed at an appropriate temperature to increase physical strength.

Another system that employs a titanium adhesion layer is described by Morabito et al. in an article entitled "Material Characterization of Ti-Cu-Ni-Au (TPCA)—A New Low Cost Thin-Film Conductor System," *IEEE Transactions on Parts, Hybrids, and Packaging,* Vol. PHP-11, No. 4, December 1975.

When a circuit is formed by a process of the type described, the surfaces of components are exposed, with the conductive paths touching, but not covering, the components. Some components, particularly NiCr resistors, are subject to damage by abrasion and by contact with moisture. To protect against damage, it is current practice to coat the exposed components with a polymer material.

Although effective, the prior systems suffer from a number of disadvantages. The material costs of all such systems are relatively high since multiple layers of Au are typically required. Although other highly conductive materials are less expensive than gold, they are not practical for use directly in contact with titanium. Copper, for example, cannot be plated directly onto titanium due to diffusion problems.

Diffusion of titanium into the overlying conductive material is undesirable for several reasons. Primarily, it prevents effective adhesion of the conductor system to a substrate. Also, diffusion of the more resistant adhesion layer undesirably increases the electrical resistance of the conductor material. Whenever titanium is used as the adhesion layer, it is difficult to manufacture conductor systems on a commercial scale since the manufacturing process must be strictly controlled to minimize the diffusion of titanium into the superposed layers. Even slight deviations from the prescribed process can cause considerable diffusion.

Furthermore, in the formation of the prior multimetal systems, an extra process step is required to physically remove the titanium adhesion layer from the board in regions that are intended to be nonconductive, specifically, from the resistors and other components that are applied before the titanium layer. A separate etching step is required to remove the titanium from the resistors and other component surfaces, since the overlying titanium would otherwise form a conductive path bypassing each component. Providing a polymer cover layer is a further added cost. It would be very beneficial to eliminate the titanium etching and polymer coating steps from the manufacturing process.

Thus, a need presently exists for conductor systems which are highly conductive, and yet are formed from low-cost materials using simple manufacturing processes.

SUMMARY OF THE INVENTION

The present invention is an inexpensive, highly conductive, thin-film conductor system.

As in the prior art, conductor systems of the present invention are formed by the deposition of multiple superposed metal layers. However, a new combination of materials and process of manufacture are employed.

After certain components, such as NiCr resistors, are fixed on a desired substrate, zirconium is applied on the substrate as the first layer of the conductor system. The zirconium, which adheres to components such as NiCr resistors and to substrate materials such as ceramic wafers of aluminum oxide, serves as an adhesion surface for a subsequently deposited layer. A conductive layer, which itself may consist of one or more layers of a highly conductive metal, is then deposited, in a desired pattern, on the zirconium to define the conductive path.

Zirconium is superior to titanium in that zirconium has a relatively low resistivity of 41 microohm-cm (*CRC Handbook of Chemistry and Physics*—1974, p. D150). Also, because a zirconium adhesion layer does not suffer from the problem of a high diffusivity, it is possible to complete the conductor system by forming the conductive layer from an inexpensive, yet highly conductive material such as copper, without necessarily using additional layers of a third metal. A further advantage of the zirconium adhesion layer is that it need never be removed from components such as NiCr resistors or from other regions where conductivity is not to be provided.

According to one aspect of the invention, a conductor system is formed by depositing a layer of zirconium followed by layers of other conductive metals. The other conductive metals are printed or etched so that they leave a desired pattern of conductive paths between the components. But, such procedures do not remove any portion of the zirconium, which therefore is exposed in certain areas and can remain as a covering over the surfaces of components, such as NiCr resistors, that were present on the board before the zirconium layer was applied. The exposed regions of zirconium can be rendered nonconductive by heating in the presence of oxygen. Heating converts the exposed areas of zirconium into zirconium oxide, which is nonconductive and thus can serve as a protective layer over circuit components. Such a layer is of particular importance in protecting NiCr resistors which are susceptible to damage by abrasion and moisture.

Thus, the process of the present invention reduces expenses and eliminates or reduces the difficulty of several process steps. Specifically, in prior systems that employ a titanium adhesion layer, the titanium must be etched off of the component surfaces to avoid short-circuiting. And, if protection is desired for components such as NiCr resistors, a plastic material, such as polyimide, is applied. These extra steps are eliminated by the use of a zirconium substrate layer.

In one particular embodiment of the present invention, five layers are employed. First, a zirconium layer and then two copper layers are deposited on a substrate. Copper is then removed, by etching, from the regions which are to be nonconductive. This leaves the substrate covered with the layer of zirconium, on which are the desired copper paths. The zirconium is exposed in the areas between the paths. To protect the copper from oxidizing, layers of electroless nickel and electroless gold may be deposited on the copper paths, still leaving the zirconium layer exposed in areas which are to be nonconductive. After deposition of all layers, the unit is thermally treated in air. In the areas where the zirconium layer is exposed, it oxidizes, forming a nonconductive layer of zirconium oxide. Components under the zirconium oxide are protected from abrasion and moisture.

In another embodiment, three metallic layers are employed. First, a zirconium layer is deposited on a substrate. Next, two layers of electroless gold are deposited. The gold is selectively removed to leave a pattern of conductive paths and to expose the zirconium layer in the regions between the paths. The unit is then heated and in the presence of air to oxidize the exposed area's zirconium. Although employing two layers of gold, this system is an improvement over the prior art in that very few steps are required to form the conductive paths, there is a reduced number of defective parts since metal diffusion is much less of a problem, and circuit components are protected without adding a polymer coating.

Accordingly, it is an object of the present invention to form a thin-film conductor system using a minimum of manufacturing steps.

A further object is to provide a conductor system which can be formed by a process that does not require extremely tight manufacturing tolerances.

A related object is to provide a thin-film conductor system which can be manufactured with little concern over metal diffusion problems.

It is a still further object of this invention to provide a thin-film conductor system which does not require etching of an adhesion layer.

Yet another object is to provide a protective layer over circuit components such as NiCr resistors, without a separate coating step.

Also an object is to provide a conductor system with a minimum number of metal layers and thereby reduce manufactering and materials costs.

An object of some embodiments is to reduce the use of costly metals, such as gold.

It is a feature of the present invention to provide a thin-film conductor system using an adhesion layer of zirconium.

It is also a feature of the present invention to provide a thin-film conductor system wherein circuit components, such as NiCr resistors, are protected by a covering of zirconium oxide.

A specific feature is to oxidize exposed areas of the zirconium layer to render the areas nonconductive and simultaneously form the protective covering.

Other objects and features of the present invention will become apparent from the following detailed description considered in connection with the accompanying drawings. It is to be understood, however, that the drawings are for the purpose of illustration only, and not as a definition of the limits of invention.

DETAILED DESCRIPTION

The present invention will best be understood with reference to the drawings which illustrate, for two embodiments of the invention, procedures of forming thin-film conductor systems.

FIGS. 1-7 show a first embodiment of the invention. In this embodiment, a substrate 20 is provided to support a thin-film circuit. Any of the nonconducting substrate materials normally used in thin film technology may be used as a substrate. Examples of such materials include alumina, quartz, fused silica, beryllia, glass, forsterite, polyimide, and oxidized silicon.

Ceramic substrates, such as wafers of alumina, are well suited for use with the present invention. Circuits can also be formed according to the present invention on such active substrates as silicon chips. In such circuits, the conductor system and chip are separated by a suitable insulation layer (not shown).

A circuit is formed by mounting components, such as a NiCr resistor 21, on the substrate. NiCr resistors and other thin metal elements of the circuit are formed using the standard vacuum deposition techniques of sputtering or evaporation. In the case of the resistors, a layer of the NiCr alloy is deposited on a surface of the substrate. Areas of the alloy are then selectively removed, using a photoresist technique, to leave resistors of the desired geometry.

The circuit components are joined by thin-film, electrically conductive paths formed by deposition of metal layers in a desired pattern.

Figure 1:
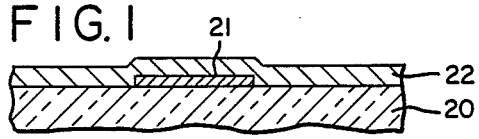
FIGS. 1-7 are cross-sectional views of a portion of a thin-film circuit in various stages of fabrication in accord with a first embodiment of the invention.

As a first step in forming the conductive paths, a layer of zirconium 22 is deposited over the a substrate material 20 (and any components mounted thereon) to provide a good surface on which to deposit one or more conductor layers. The zirconium layer 22, shown in FIG. 1, is deposited at a thickness from about 250 to 2,000 angstroms, most preferably about 1,000 angstroms.

Figure 2:
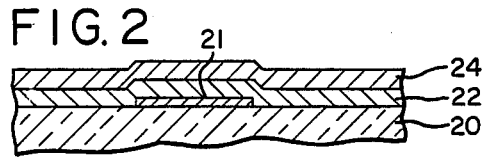
Figure 3:
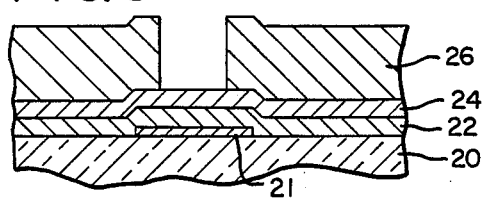

Next, a copper layer 24 is deposited on the zirconium layer 22 by sputtering or evaporation to a desired thickness of from $5.0 \times 10^{-6}$ cm to $1.0 \times 10^{-4}$ cm, as indicated in FIG. 2. A second copper layer 26 is pattern-plated over the primary copper layer 24 to a thickness of from $1.0 \times 10^{-4}$ cm to $1.0 \times 10^{-3}$ cm to form the structure of FIG. 3. The pattern plating process involves the application and imaging of a photoresist layer in a defined pattern on copper layer 24. Copper layer 26 is then applied to layer 24 and retained on the areas defined by the photoresist image.

Figure 4:
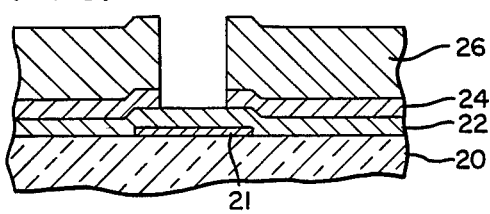
Figure 5:
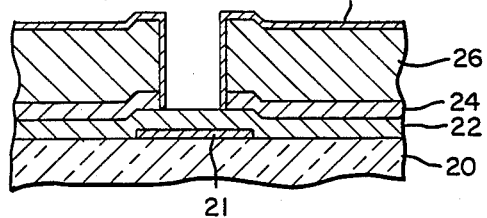
Figure 6:
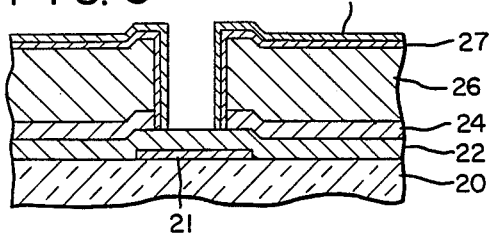

As shown in FIG. 4, portions of copper layer 24 are then removed from the areas that are to be nonconductive. The removal is accomplished by a standard method, such as chemical or plasma etching. The selective removal of copper layers exposes areas of the initial zirconium layer 22. To protect the copper from oxidizing, a layer of electroless nickel 27 is then deposited to a thickness of $5.0 \times 10^{-6}$ cm to $5.0 \times 10^{-5}$ cm over the remaining copper layers 24 and 26, using a technique which leaves the zirconium exposed over resistor 21, as can be seen in FIG. 5. FIG. 6 shows the conductor system after a final layer 28 of electroless gold is deposited, to a depth of $5.0 \times 10^{-6}$ to $4.0 \times 10^{-5}$ cm over the nickel layer 27. The zirconium layer remains exposed in the areas that are to be nonconductive, such as the area over the resistor 21.

Figure 7:
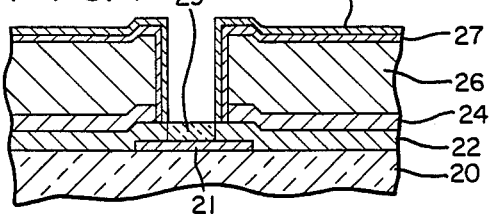

The resulting multi-layer unit is thermally treated in an oxidizing environment (e.g., air) at temperatures from 250° to 400° C. The unit is maintained within this temperature range for a sufficient period of time to allow proper annealing and zirconium oxidation. Treatment time is a function of the temperature used. In the oxidizing environment, areas of exposed zirconium are converted to areas of zirconium oxide. FIG. 7 shows such a zirconium oxide area 29 which serves as a protective covering for the resistor 21 to inhibit damage from moisture and abrasion.

Figure 8:
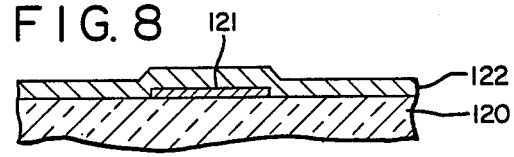
FIGS. 8-12 are cross-sectional views of a portion of a thin-film circuit in various stages of fabrication in accord with a second embodiment of the invention.
Figure 9:
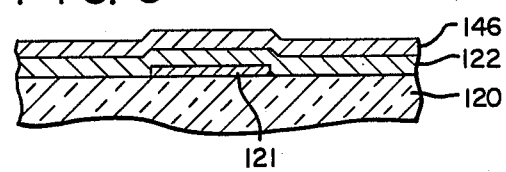
Figure 10:
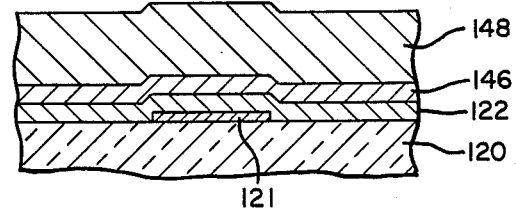
Figure 11:
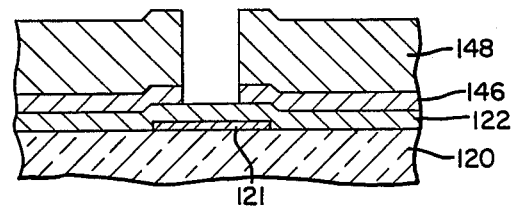
Figure 12:
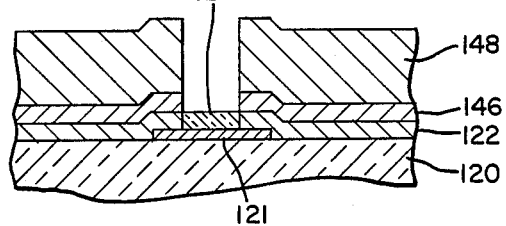

FIGS. 8-12 represent another embodiment of the invention. In FIG. 8, a layer of zirconium 122 is deposited to a thickness of from $2.5 \times 10^{-6}$ cm to $2.0 \times 10^{-5}$ cm, by sputtering or evaporation, on a substrate 120 and a resistor 121. A first gold layer 146, as shown in FIG. 9, is then deposited by evaporation or sputtering over the zirconium layer 122 to a thickness of from $5.0 \times 10^{-6}$ cm to $1.0 \times 10^{-4}$ cm. A second gold layer 148 is electroplated over the primary gold layer 146 to a thickness of from $1.0 \times 10^{-4}$ to $1.0 \times 10^{-3}$ cm, as in FIG. 10. Next, gold is removed using a standard method, such as plasma or chemical etching, from the areas that are to be nonconductive, the resulting structure being shown in FIG. 11. Zirconium is exposed in those areas where the gold was removed. The resulting unit is then thermally treated and oxidized, as described above, to form the product shown in FIG. 12, which has a protective zirconium oxide area 129 located over the NiCr resistor 121.

While only two embodiments of the present invention have been shown and described, it will be apparent that many changes and modifications can be made hereto without departing from the spirit and scope of this invention. In particular, there are numerous combinations of metal layers which could be used, over the zirconium layer, to provide effective, inexpensive conductor systems, using a minimum of process steps.

We claim:

1. A circuit board comprising:
    a substrate;
    thin-film conductive pathways, each including a layer of zirconium on the substrate and a conductive layer on the zirconium layer; and
    nonconductive regions of zirconium oxide on the substrate, the regions being located between the pathways.

2. A method for forming an electrically conducting pathway, comprising
    providing on a substrate a layer of zirconium that extends from a first location on the sbbstrate to a second location on the substrate, and
    providing a conductive layer over the zirconium layer in a pattern that leaves the zirconium layer exposed in regions where a conductive pathway is not desired,
    wherein said conductive layer is formed by depositing a primary copper layer on the zirconium at a thickness of from $5.0 \times 10^{-6}$ cm to $1.0 \times 10^{-4}$ cm, and depositing a secondary copper layer on the primary copper layer at a thickness of from $1.0 \times 10^{-4}$ cm to $1.0 \times 10^{-3}$ cm.

3. The method of claim 2 further comprising:
    depositing a nickel layer on the secondary copper layer at a thickness of from $5.0 \times 10^{-6}$ cm to $5.0 \times 10^{-5}$ cm; and
    depositing a gold layer on the nickel layer at a thickness of from $5.0 \times 10^{-6}$ cm to $4.0 \times 10^{-5}$ cm.

4. A thin-film metal conductor system comprising
    a substrate,
    a layer of zirconium on the substrate, and
    a conductive layer on the zirconium layer patterned in such a manner that the zirconium layer is exposed in regions where a conductive pathway is not desired,
    said conductive layer being formed of a plurality of metal layers, comprising a primary copper layer on the zirconium layer at a thickness of from $5.0 \times 10^{-6}$ cm to $1.0 \times 10^{-4}$ cm, and a secondary copper layer on the primary copper layer at a thickness of from $1.0 \times 10^{-4}$ cm to $1.0 \times 10^{-3}$ cm.

5. The thin-film metal conductor system of claim 4 in which the metal layers further comprise:
    a nickel layer on the secondary copper layer at a thickness of from $5.0 \times 10^{-6}$ cm to $5.0 \times 10^{-5}$ cm; and
    a gold layer on the nickel layer at a thickness of from $5.0 \times 10^{-6}$ cm to $4.0 \times 10^{-5}$ cm.

* * * * *